United States Patent
Elers et al.

(10) Patent No.: US 7,410,666 B2
(45) Date of Patent: Aug. 12, 2008

(54) METAL NITRIDE CARBIDE DEPOSITION BY ALD

(75) Inventors: Kai Elers, Helsinki (FI); Wei-Min Li, Espoo (FI)

(73) Assignee: ASM International N.V. (NL)

( * ) Notice: Subject to any disclaimer, the term of this patent is extended or adjusted under 35 U.S.C. 154(b) by 249 days.

(21) Appl. No.: 11/286,203

(22) Filed: Nov. 22, 2005

(65) Prior Publication Data

US 2006/0078679 A1 Apr. 13, 2006

Related U.S. Application Data

(62) Division of application No. 10/242,368, filed on Sep. 12, 2002, now Pat. No. 6,986,914.

(60) Provisional application No. 60/322,385, filed on Sep. 14, 2001.

(51) Int. Cl.
*B05D 5/12* (2006.01)
*C23C 16/00* (2006.01)
*H01L 21/44* (2006.01)

(52) U.S. Cl. .................. 427/97.7; 427/96.8; 427/98.1; 427/255.28; 427/394; 438/643; 438/653; 438/678; 438/687

(58) Field of Classification Search ............... 427/96.8, 427/97.7, 98.1, 255.28, 255.394; 438/643, 438/653, 678, 687

See application file for complete search history.

(56) References Cited

U.S. PATENT DOCUMENTS

| | | | |
|---|---|---|---|
| 3,708,728 A | 1/1973 | Sterling et al. | |
| 4,058,430 A | 11/1977 | Suntola et al. | |
| 4,565,747 A | 1/1986 | Nakae et al. | |
| 4,935,661 A | 6/1990 | Heinecke et al. | |
| 5,281,274 A | 1/1994 | Yoder | |
| 5,306,666 A | 4/1994 | Izumi | |
| 5,316,793 A | 5/1994 | Wallace | |

(Continued)

FOREIGN PATENT DOCUMENTS

| | | |
|---|---|---|
| EP | 0 387 403 A1 | 10/1989 |
| EP | 0 394 054 A1 | 4/1990 |
| EP | 0 442 490 A1 | 8/1991 |
| EP | 0 573 033 A1 | 6/1993 |
| EP | 0 774 533 A1 | 10/1996 |

(Continued)

OTHER PUBLICATIONS

"Kirk-Othmer Encyclopedia of Chemical Technology," 4th Edition, vol. 4, John Wiley & Sons, Inc. pp. 841-878, (1992).

(Continued)

*Primary Examiner*—Brian K Talbot
(74) *Attorney, Agent, or Firm*—Knobbe, Martens, Olson & Bear, LLP

(57) ABSTRACT

The present methods provide tools for growing conformal metal thin films, including metal nitride, metal carbide and metal nitride carbide thin films. In particular, methods are provided for growing such films from aggressive chemicals. The amount of corrosive chemical compounds, such as hydrogen halides, is reduced during the deposition of transition metal, transition metal carbide, transition metal nitride and transition metal nitride carbide thin films on various surfaces, such as metals and oxides. Getter compounds protect surfaces sensitive to hydrogen halides and ammonium halides, such as aluminum, copper, silicon oxide and the layers being deposited, against corrosion. Nanolaminate structures incorporating metallic thin films, and methods for forming the same, are also disclosed.

27 Claims, 6 Drawing Sheets

U.S. PATENT DOCUMENTS

| | | | |
|---|---|---|---|
| 5,342,652 | A | 8/1994 | Foster et al. |
| 5,382,333 | A | 1/1995 | Ando et al. |
| 5,438,028 | A | 8/1995 | Weissman et al. |
| 5,603,771 | A | 2/1997 | Seiberras et al. |
| 5,691,235 | A | 11/1997 | Meikle et al. |
| 5,711,811 | A | 1/1998 | Suntola et al. |
| 5,723,384 | A | 3/1998 | Park et al. |
| 5,744,254 | A | 4/1998 | Kampe et al. |
| 5,789,024 | A | 8/1998 | Levy et al. |
| 5,915,004 | A | 6/1999 | Pabbati et al. |
| 5,916,365 | A | 6/1999 | Sherman |
| 5,939,334 | A * | 8/1999 | Nguyen et al. ............. 438/689 |
| 5,946,598 | A | 8/1999 | Yeh |
| 5,964,943 | A | 10/1999 | Stein et al. |
| 5,972,430 | A | 10/1999 | DiMeo, Jr. et al. |
| 6,006,763 | A | 12/1999 | Mori et al. |
| 6,099,904 | A | 8/2000 | Mak et al. |
| 6,143,658 | A * | 11/2000 | Donnelly et al. ........... 438/687 |
| 6,156,382 | A | 12/2000 | Rajagopalan et al. |
| 6,162,501 | A | 12/2000 | Kim et al. |
| 6,206,967 | B1 | 3/2001 | Mak et al. |
| 6,287,965 | B1 | 9/2001 | Kang et al. |
| 6,380,627 | B1 | 4/2002 | Weihs et al. |
| 6,541,842 | B2 * | 4/2003 | Meynen et al. ............. 257/632 |
| 6,921,712 | B2 * | 7/2005 | Soininen et al. ............ 438/597 |
| 2003/0032281 | A1 * | 2/2003 | Werkhoven et al. ........ 438/640 |
| 2003/0049931 | A1 | 3/2003 | Byun et al. |
| 2003/0104126 | A1 | 6/2003 | Fang et al. |
| 2003/0123216 | A1 | 7/2003 | Yoon et al. |
| 2003/0127043 | A1 | 7/2003 | Lu et al. |
| 2003/0153181 | A1 | 8/2003 | Yoon et al. |
| 2003/0157760 | A1 | 8/2003 | Xi et al. |
| 2003/0161952 | A1 | 8/2003 | Wang et al. |
| 2003/0181035 | A1 | 9/2003 | Yoon et al. |
| 2003/0194825 | A1 | 10/2003 | Law et al. |
| 2003/0203616 | A1 | 10/2003 | Chung et al. |

FOREIGN PATENT DOCUMENTS

| | | |
|---|---|---|
| EP | 0 899 779 A2 | 3/1999 |
| EP | 1 167 567 A1 | 2/2002 |
| JP | 6037041 | 2/1994 |
| JP | 7230957 | 8/1995 |
| JP | 8 264 530 A | 10/1996 |
| WO | WO 96/17107 | 6/1996 |
| WO | WO 96/18756 | 6/1996 |
| WO | WO 98/51838 | 11/1998 |
| WO | WO 00/01006 | 1/2000 |
| WO | WO 00/47796 | 8/2000 |
| WO | WO 01/27347 | 4/2001 |
| WO | WO 01/28981 | 4/2001 |
| WO | WO 01/29280 | 4/2001 |
| WO | WO 01/29893 | 4/2001 |
| WO | WO 01/66832 | 9/2001 |
| WO | WO 01/78123 | 10/2001 |
| WO | WO 01/88972 | 11/2001 |

OTHER PUBLICATIONS

Bain et al., "Deposition of tungsten by plasma enhanced chemical vapour deposition," *J. Phys. IV France*, vol. 9, pp. 827-833 (1999).

Elers et al., "NbCl5 as a precursor in atomic layer epitaxy," *Applied Surface Science*, 82/83:468-474 (1994).

Girolami et al., "Tailored Organometallics as Low-Temperature CVD Precursors to Thin Films," *Materials Research Society Symposium Proceedings*, vol. 121, pp. 429-438, (1988).

Helmut Tulhoff et al., "Ullmann's Encyclopedia of Industrial Chemistry," 5th, Completely Revised Edition, vol. A5, pp. 61-77, (1986).

Hermann Jehn, Gudrun Bär, Erich Best, and Ernst Koch, "Gmelin Handbook of Inorganic and Organometallic Chemistry," 8th Edition, vol. A 5b, No. 54, pp. 131-154, (1993).

Hiltunen et al., "Nitrides of titanium, niobium, tantalum and molybdenum grown as thin films by the atomic layer epitaxy method," *Thin Solid Films*, 166:149-154 (1988).

Jeon, H., "A Study on the Characteristics of TiN Thin Film Deposited by Atomic Layer Chemical Vapor Deposition Method," *AVS 46th International Symposium*, Seattle, WA, abstract TF-MoP17 (1999).

Jeon, H., et al., "A Study on the Characteristics of TiN Thin Film Deposited by Atomic Layer Chemical Vapor Deposition Method," *J. Vac .Sci. Technol. A*, 18(4), 1595-1598 (2000).

Juppo et al., "Deposition of copper films by an alternate supply of CuCl and Zn," *J. Vac. Sci. Technol A*, vol. 15, No. 4, pp. 2330-2333, (Jul./Aug. 1997).

Klaus et al., "Atomic Layer Deposition of Tungsten Nitride Films Using Sequential Surface Reactions," *Journal of the Electrochemical Society*, vol. 147, No. 3, pp. 1175-1181, (2000).

Klaus et al.,"Atomic layer deposition of tungsten using sequential surface chemistry with a sacrificial stripping reaction," *Thin Solid Films*, vol. 360, pp. 145-153, (2000).

Klaus, J.W., et al., "Atomic layer deposition of tungsten and tungsten nitride using sequential surface reactions," *AVS 46th International Symposium*, Seattlhe, WA, abstract TF-TuM6 (1999).

Klaus, J.W., S.J. Ferro, and S.M. George, "Atomically controlled growth of tungsten and tungsten nitride using sequential surface reactions," *Applied Surface Science*, vols. 162-163, pp. 479-491, (2000).

Lai, Ken K. and H. Henry Lamb, "Precursors for Organometallic Chemical Vapor Deposition of Tungsten Carbide Films," *Chem. Mater.*, vol. 7, pp. 2284-2292, (1995).

Ludviksson et al., "Low-Temperature Thermal CVD of Ti-Al Metal Films Using a Strong Reducing Agent," *Chem. Vap. Deposition*, vol. 4, No. 4, pp. 129-132, (1998).

Martensson et al., "Atomic Layer Epitaxy of Copper and Tantalum," *Chemical Vapor Deposition*, vol. 3, No. 1, pp. 45-50, (1997).

Martensson et al., "CU(THD)$_2$ As Copper Source in Atomic Layer Epitaxy," *Electrochemical Society Proceedings*, vol. 97-25, pp. 1529-1536.

Martensson, "Use of atomic layer epitaxy for fabrication of Si/TiN/Cu structures," *J. Vac. Sci. Technol. B*, vol. 17, No. 5, pp. 2122-2128, (Sep./Oct. 1999).

Min, Jae-Sik, Young Woong Son, Won-Gu Kang, Soung-Soon Chun, and Sang-Won Kang, "Atomic Layer Deposition of TiN Films by Alternate Supply of Tetrakis (ethylmethylamino)-Titanium and Ammonia," *Jpn. J. Appl. Phys.*, vol. 37, pp. 4999-5004, (1998).

Min,Jae-Sik, Young-Woong Son, Won-Gu Kang, and Sang-Won Kang, "Atomic Layer Deposition of TiN Thin Films by Sequential Introduction of Ti Precursor and HN$_3$," *Mat. Res. Soc. Symp. Proc.*, vol. 514, pp. 337-342, (1998).

Nakajima et al., "Chemical Vapor Deposition of Tungsten Carbide, Molybdenum Carbide Nitride, and Molybdenum Nitride Films," *J. Electrochem. Soc.*, vol. 144, No. 6, pp. 2096-2100, (Jun. 1997).

Polyakov et al., "Growth of GaBN Ternary Solutions by Organometallic Vapor Phase Epitaxy," *Journal of Electronic Materials*, Vo. 26, No. 3, pp. 237-242, (1997).

Ritala et al., "Atomic layer epitaxy growth of TiN thin films," *J. Electrochem. Soc.*, 142(8):2731-2737 (1995).

Ritala, Mikko, Markku Leskelä, Eero Rauhala, and Janne Jokinen, "Atomic Layer Epitaxy Growth of TiN Thins Films from TiI$_4$ and NH$_3$," *J. Electrochem. Soc.*, vol. 145, No. 8, pp. 2914-2920, (Aug. 1998).

Sherman et al., "Plasma enhanced atomic layer deposition of Ta for diffusion barrier applications," AVS 46th International Symposium, Paper TF-TuM5 (abstract), (Oct. 26, 1999), Seattle, WA.

Yang et al., "Atomic Layer Deposition of Tungsten Films from WF6/B2H6: Nucleation Layer for Advanced Semiconductor Devices", Advanced Metallization Conference, 2001, pp. 655-660.

* cited by examiner

METAL NITRIDE CARBIDE DEPOSITION BY ALD

CROSS-REFERENCE TO RELATED APPLICATIONS

The present application is a divisional of U.S. patent application Ser. No. 10/242,368, filed Sep. 12, 2002, now U.S. Pat No. 6,986,914, which claims priority under 35 U.S.C. §119(e) to provisional application No. 60/322,385, filed Sep. 14, 2001.

BACKGROUND OF THE INVENTION

Atomic layer deposition (ALD), originally known as atomic layer epitaxy (ALE), is an advanced form of vapor deposition. ALD processes are based on sequential self-saturated surface reactions. Examples of these processes are described in detail in U.S. Pat. Nos. 4,058,430 and 5,711,811. The described deposition processes benefit from the usage of inert carrier and purging gases, which make the system fast. Due to the self-saturating nature of the process, ALD enables almost perfectly conformal deposition of films on an atomically thin level.

The technology was initially developed for manufacturing thin film structures for electroluminescent flat panel displays and for conformal coating of chemical catalysts that desirably exhibited extremely high surface area. More recently, ALD has found application in the fabrication of integrated circuits. The extraordinary conformality and control made possible by the technology lends itself well to the increasingly scaled-down dimensions demanded of state-of-the-art semiconductor processing.

A method for depositing thin films on sensitive surfaces by ALD is described in WO 01/29839.

While ALD has many potential applications to semiconductor fabrication, integrating these new processes into established process flows introduces many new issues. Accordingly, a need exists for improved ALD processes.

FIELD OF THE INVENTION

The present invention relates generally to depositing thin films on substrates by alternated self-saturating chemistries. More particularly, the present invention relates to thin films deposited on a substrate by atomic layer deposition (ALD) while employing corrosive species during their formation.

SUMMARY OF THE INVENTION

In accordance with one aspect of the invention, a method is provided for depositing a material on a substrate in a reaction space. The substrate may have a surface that is susceptible to halide attack. The method includes providing alternated pulses of reactants in a plurality of deposition cycles, where each cycle comprises:
  a first phase in which a first reactant is supplied to the reaction space and chemisorbs no more than about one monolayer of a metal species over the surface of the substrate;
  a second phase in which a second reactant is supplied to the reaction space; and
  a third phase in which a chemical that is capable of gettering halides from the monolayer is supplied to the reaction space, wherein the first phase is not followed immediately by the third phase.

In the illustrated embodiments, the phases are separated by inert gas flow periods that purge the reactants and reaction by-products. The second reactant contributes a species, such as nitrogen, carbon or oxygen, to the growing film. The third reactant is a carbon compound that is a strong reducer, particularly stronger than $H_2$. The third reactant also serves as a carbon source in the illustrated embodiment, forming a metal nitride carbide. In some arrangements, additional phases can also be employed.

In another aspect the invention provides a method of forming a $WN_xC_x$ thin film on a substrate within a reaction space by an atomic layer deposition (ALD) type process. The ALD process comprises providing alternating pulses of reactants in a plurality of deposition cycles. Preferably, each cycle comprises supplying in order: $WF_6$; $NH_3$; and triethyl boron (TEB). Excess reactant and/or reactant byproducts are preferably removed from the reaction space prior to supplying the next reactant.

BRIEF DESCRIPTION OF THE DRAWINGS

These and other aspects of the invention will be readily apparent to the skilled artisan in view of the description below and the appended drawings, which are meant to illustrate and not to limit the invention, and in which.

DETAILED DESCRIPTION OF THE PREFERRED EMBODIMENT

Figure 1:
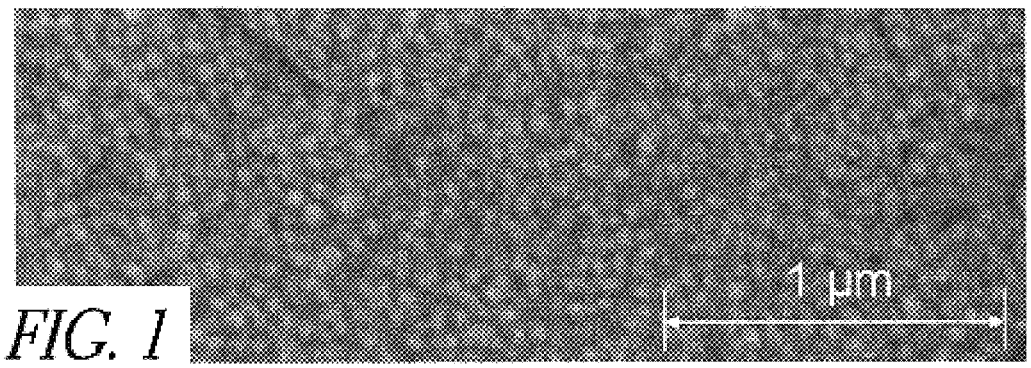
FIG. 1 is a scanning electron micrograph (SEM) taken of a copper film formed by physical vapor deposited (PVD). The measurement voltage was 10 kV.

The present disclosure teaches methods for depositing metal thin films by an ALD type process, particularly on sensitive surfaces. The skilled artisan will appreciate that the present methods have applications in many contexts.

Definitions

For the purpose of the present description, an "ALD process" designates a process in which deposition of material onto a surface is based on sequential and alternating self-saturating surface reactions. The general principles of ALD are disclosed, e.g., in U.S. Pat. Nos. 4,058,430 and 5,711,811, the disclosures of which are incorporated herein by reference. Generally, conditions for ALD include a temperature window wherein the substrate is above the temperature at which source gases condense and below the temperature at which the source gases thermally decompose.

"Reaction space" is used to designate a reactor or reaction chamber, or an arbitrarily defined volume therein, in which conditions can be adjusted to effect thin film growth by ALD. Typically the reaction space includes surfaces subject to all reaction gas pulses from which gases or particles can flow to the substrate, by entrained flow or diffusion, during normal operation.

"Adsorption" is used to designate a chemical attachment of atoms or molecules on a surface.

"Surface" is used to designate a boundary between the reaction space and a feature of a substrate.

A "sensitive surface" is a surface that is susceptible to corrosion, particularly in the presence of halides. Sensitive surfaces include, but are not limited to, surfaces comprised of metals such as aluminum and copper, as well as surfaces comprised of silicon compounds such as silicon oxide and silicon nitride.

"Getter," "gettering agent" or "scavenger" is used to designate a volatile species that is capable of forming new volatile compounds from halogen or halide species, such as those corrosive species that may be present on the substrate surface or in the reaction space during deposition of a metal-containing thin film (e.g., hydrogen halides or ammonium halides). Typically, the new halogen compounds are less corrosive to exposed features of the workpiece than are hydrogen halides or ammonium halides.

The symbols "—" and "=" attached with one end to an atom designate the number of bonds to unspecified atoms or ions.

A subscript "x" in metal nitrides (e.g., $WN_x$ or $TiN_x$) is used to designate the transition metal nitrides that are not necessarily stoichiometric, having a wide range of phases with varying metal/nitrogen ratios.

A subscript "y" in metal carbides (e.g., $WC_y$ or $TiC_y$) is used to designate the transition metal carbides that are not necessarily stoichiometric, having a wide range of phases with varying metal/carbon ratios.

"Nanolaminate" and "nanolaminate structure" refers to a layered structure comprising stacked thin film layers of different phases with respect to the growth direction of the nanolaminate. "Alternating" or "stacked" means that the adjacent thin film layers differ from each other by some measure.

"Thin film" means a film that is grown from elements or compounds that are transported as separate ions, atoms or molecules via vacuum, gaseous phase or liquid phase from the source to the substrate. The thickness of the film depends upon the application and may vary in a wide range, preferably from one atomic layer to 1,000 nm. When incorporated into a nanolaminate, the thin film is preferably less than about 20 nm in thickness, even more preferably less than about 10 nm and most preferably less than about 5 nm.

"Metallic thin film" designates a thin film that comprises metal. A metallic thin film may be an elemental metal thin film comprised essentially of elemental metal. Depending on the reducing agent the elemental metal thin film may contain some metal carbide and/or metal boride in an amount that does not have a negative effect on the characteristic metal properties of the film, or the characteristic properties of a nanolaminate. In addition, a metallic thin film may be a compound metal thin film comprised essentially of compound metal, such as metal nitride, metal carbide or metal nitride carbide (e.g., $WN_xC_y$).

Integration Issues

Halides generally, and particularly transition metal halides, are attractive source chemicals for ALD due to their high volatility and durability against thermal decomposition. Of these halides, compounds that are liquids or gases near room temperature, such as $TiCl_4$ and $WF_6$, are preferred because they do not generate solid particles at the source container. In addition to their volatility, many such halide compounds are particularly useful for ALD processing because they allow chemisorption of a species of interest (e.g., a metal-containing species), leaving no more than a monolayer of the species terminated with halide tails. The halide tails prevent further chemisorption or reaction of the species of interest, such that the process is self-saturating and self-limiting under the right temperature conditions.

Figure 2:
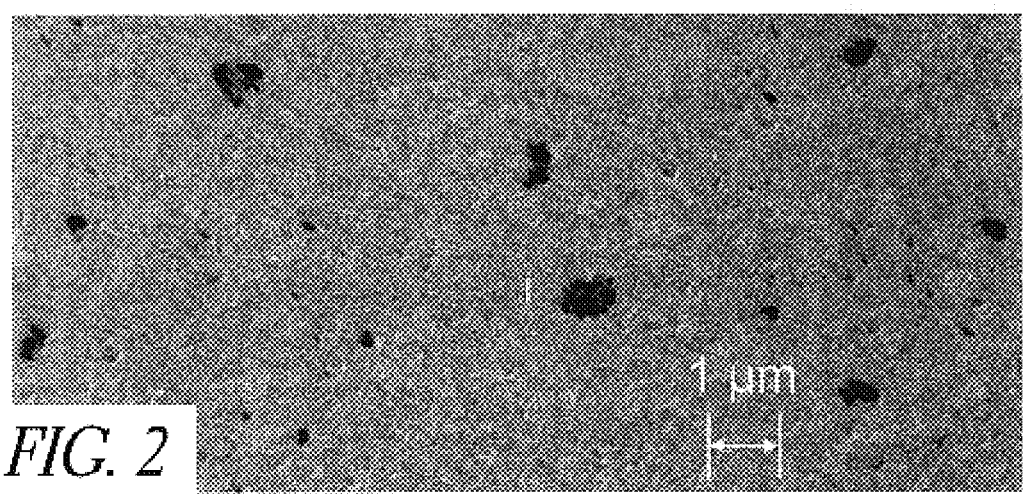
FIG. 2 is an SEM taken of a PVD-copper film covered with TiN in accordance with an ALD process that did not employ a getter or scavenger pulse. The black areas of the picture indicate areas of the copper etched during the TiN processing.

Metal halides can be employed, for example, in the formation of compound metal thin films, such as metal nitride, metal carbide and metal nitride carbide thin films, by ALD processes. However, these processes have not resulted in the perfectly conformal deposition desired of ALD. FIG. 2 and the discussion of Examples 1, 2 and 4 demonstrate, for example, corrosive damage sustained by "exposed" copper during ALD formation of metal nitrides and carbides using metal halides alternated with ammonia. In fact, such damage can be sustained even when the copper is covered by 5 nm of tungsten metal. Thus, a sensitive surface can include a thinly covered copper layer (e.g., covered by ≦1 nm of another material).

ALD processes using metal halides and chemicals with high hydrogen content can release hydrogen halides (e.g., HF, HCl) as reaction by-products. These reactive by-products can damage certain metal surfaces, leaving deep pits in the metal or even removing all of the metal. Silicon dioxide is also prone to corrosion due to the formation of hydrogen halides.

Hydrogen halides can also combine with other reactants during an ALD phase, such as with excess $NH_3$ during a nitrogen phase, to form additional harmful species, such as ammonium halides (e.g., $NH_4F$) that exacerbate the corrosion problem. Thus, by-products from alternating halide- and hydrogen-bearing reactants tend to corrode exposed materials of a partially fabricated integrated circuit, like aluminum, copper and silicon dioxide.

Preferred workpiece

In one aspect, the present invention involves deposition of metallic thin films, such as metal carbide, metal nitride and metal nitride carbide thin films, by ALD upon the surface of a substrate. In one embodiment the thin films form nanolaminates. In particular, the preferred embodiments involve deposition upon a substrate that comprises sensitive surfaces that are susceptible to corrosion in the presence of halides, especially hydrogen halides and/or ammonium halides. Such sensitive surfaces include, for example, metals such as aluminum and copper, as well as silicon compounds such as silicon oxide and silicon nitride. As set forth in more detail below, sensitive surfaces are generally characterized as having negative or near zero Gibb's free energy ($\Delta G_f$) for reactions between the surfaces and hydrogen halides or ammonium halides.

Figure 3:
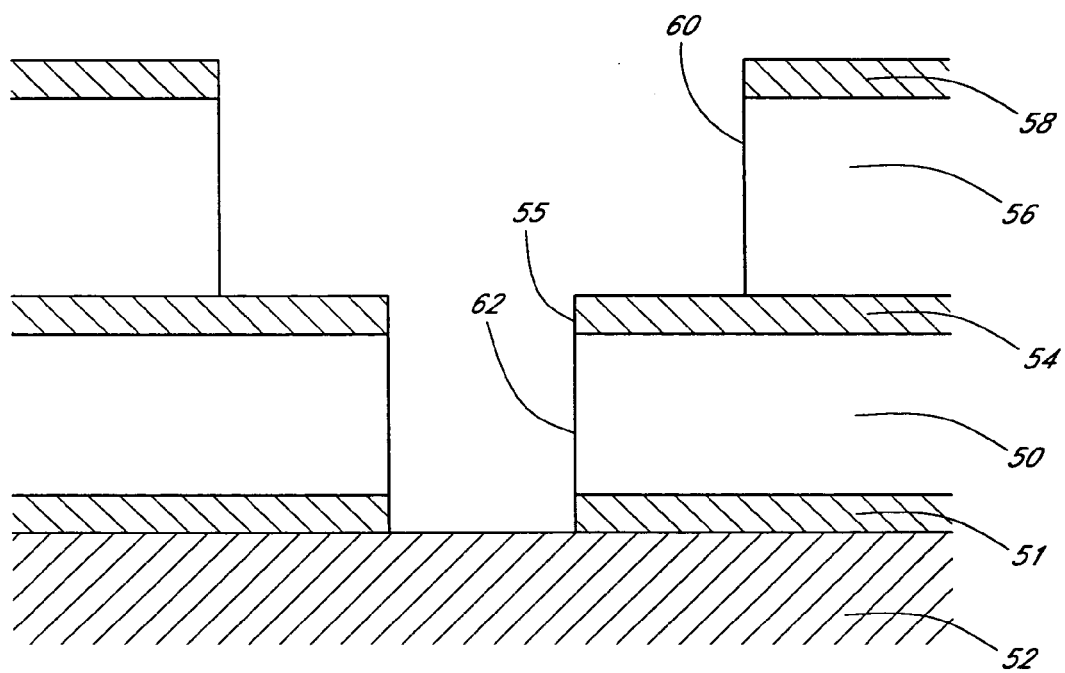
FIG. 3 is a schematic cross-section of an exemplary workpiece over which metal or metal compound deposition is desired, consisting of a dual damascene structure in a partially fabricated integrated circuit, having copper and insulating oxide surfaces exposed.

FIG. 3 illustrates a dual damascene context in which deposition is desired over a plurality of such materials simultaneously. The structure includes a first or lower insulating layer 50, preferably a form of silicon oxide, such as one deposited by plasma enhanced CVD (PECVD) employing tetraethylorthosilicate (TEOS) as a precursor. The insulating layer 50 is formed over a barrier layer 51 (e.g., silicon nitride, silicon oxynitride or silicon carbide), which in turn overlies a conductive element 52. The conductive element 52 in a dual damascene context typically comprises a highly conductive wiring metal and most preferably comprises copper. Over the first insulating layer 50 is an etch stop 54 formed of a material with a significantly different etch rate compared to the underlying insulator 50. The etch stop layer 54 (e.g., silicon nitride, silicon oxynitride or silicon carbide) includes a plurality of openings 55 across the workpiece to serve as hard mask in defining contact vias. A second or upper insulating layer 56 (also PECVD TEOS) is formed over the etch stop 54, and a polishing shield 58 to stop a later chemical mechanical planarizing (CMP) step. The polishing shield 58 typically comprises a relatively hard material, such as silicon nitride or silicon oxynitride.

As will be appreciated by the skilled artisan, the dual damascene structure is formed by photolithography and etch steps to define a plurality of trenches 60 with contact vias 62 extending from the trench floors at discrete locations. The trenches 60 serve to define wiring patterns for interconnection of electrical devices according to an integrated circuit design. The contact vias 62 define locations where electrical connection to lower electrical elements or wiring layers are desired in accordance with the circuit design.

The skilled artisan will appreciate that various alternative materials and structures can be employed to accomplish these ends. For example, while the preferred insulating layers 50, 56 comprise PECVD TEOS, in other arrangements the material of these layers can comprise any of a number of other suitable dielectric materials. For example, dielectric materials have recently been developed that exhibit low permittivity (low k), as compared to conventional oxides. These low k dielectric materials include polymeric materials, porous materials and fluorine-doped oxides. Similarly, the barrier 51, etch stop 54 and shield 58 can comprise any of a number of other materials suitable to their prescribed function. Moreover, any or all of the layers 51, 54 and 58 can be omitted in other schemes for producing dual damascene structures.

Figure 4:
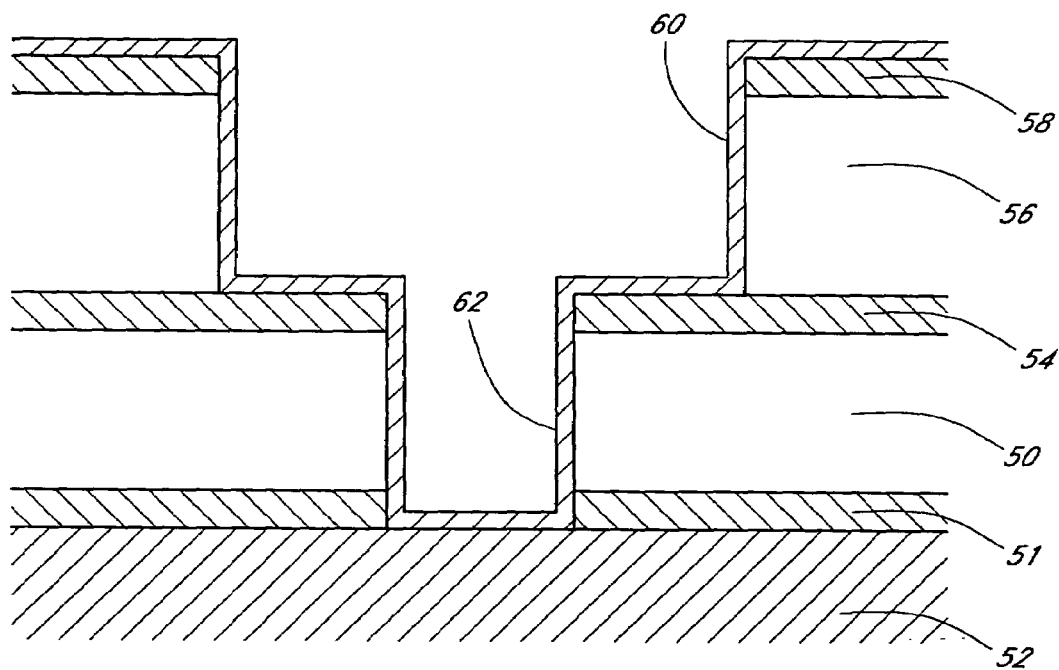
FIG. 4 illustrates the workpiece of FIG. 3 after lining the dual damascene trench and contact via with a conformal thin film in accordance with the preferred embodiments.

As shown in FIG. 4, the dual damascene trenches 60 and vias 62 are then lined with a thin film 150. The thin film 150 can be formed selectively over particular desired surfaces of the structure, but is most preferably formed in a blanket, conformal deposition by ALD, in accordance with the preferred embodiments. In the illustrated embodiment, the thin film is conductive, allowing electrical signals to flow therethrough.

Integrated circuits contain interconnects that are usually made of aluminum. Recently, copper has become an attractive material in the field. Copper is, however, prone to diffusion to surrounding materials. Diffusion affects the electrical properties of the circuits and may cause active components to malfunction. An electrically conductive diffusion barrier layer may prevent diffusion.

Conventionally, a thin lining film in a dual damascene structure includes a conductive adhesion sub-layer (e.g., tungsten metal), a barrier sub-layer (e.g., titanium nitride) and a seed sub-layer (e.g., PVD copper). The preferred thin film 150 can comprise one or more of these sub-layers, formed by ALD, and can also comprise one or more sub-layers formed by other methods. It is generally desirable to minimize the thickness of lining layers to maximize the volume of the structure occupied by a later-deposited highly conductive metal (preferably copper). To this end, the preferred embodiments also provide means for depositing barrier layers directly over both oxide and copper surfaces (or other sensitive surfaces) without etching the sensitive surfaces, and for depositing barrier layers over extremely thin adhesion layers without corrosion.

As will be appreciated by the skilled artisan, following formation of the thin film 150, the trench 60 and via 62 can be filled with a highly conductive material, such as electroplated copper. A polishing step then ensures individual lines are isolated within the trenches 60.

In metallization processes used in the fabrication of integrated circuits, such as the dual damascene process described above, copper of the previous metallization layer is typically exposed to the gas atmosphere on the floor of the via. As a result, it is prone to oxidation and to the formation of copper oxides on the surface of the copper metal. Copper oxides have poor electrical conductivity. Thus, it is beneficial to remove or reduce these copper oxides within the same chamber before the deposition of the diffusion barrier on the surfaces of the vias and trenches. An example of a method for eliminating the copper oxides by reduction is presented in WO01/88972, the disclosure of which is incorporated herein by reference. Gaseous organic compounds that contain at least one functional group selected from —OH (alcohol), —CHO (aldehyde) and —COOH (carboxylic acid) may be used for reducing the copper oxides into elemental copper. The diffusion barrier can then be grown on a pure copper metal surface. As a result, the contact resistance between copper and the diffusion barrier will be very small.

Amorphous films are believed to enhance the properties of diffusion barriers because diffusion is favored along the grain boundaries of the thin films. Diffusion barrier materials are typically selected, for example, from metal nitrides (such as titanium nitride TiN, tantalum nitride TaN and tungsten nitride WN), metal carbides (such as tungsten carbide $WC_y$) and nanolaminates (such as WN/TiN). Favored diffusion barriers are transition metal nitrides, such as $TiN_x$, $TaN_x$ and $WN_x$. Metal carbides (e.g., $WC_y$) and metal nitride carbides (e.g., $WN_xC_y$) have also been found to be good conductive diffusion barriers.

Methods of depositing metal nitrides are disclosed, for example, in WO01/27347, the disclosure of which is incorporated herein by reference. Deposition of transition metal carbides (e.g. tungsten carbide) has been presented, for example, in WO01/29280, the disclosure of which is incorporated herein by reference. Methods of depositing nanolaminates are disclosed, for example, in WO01/29893, the disclosure of which is incorporated herein by reference.

In one aspect of the invention, excellent diffusion barrier properties (such as thin film thickness and resistivity uniformity, adhesion and efficiency in preventing the diffusion of copper) are obtained by pulsing ALD source chemicals in certain sequences to the reaction chamber to deposit thin films that consist of transition metals or transition metal compounds, preferably transition metal nitride carbides, more preferably tungsten nitride carbide.

Experiments have shown that it is possible to apply the methods taught herein to depositing thin films into features with aspect ratios of up to 45:1 and higher.

Figure 7:
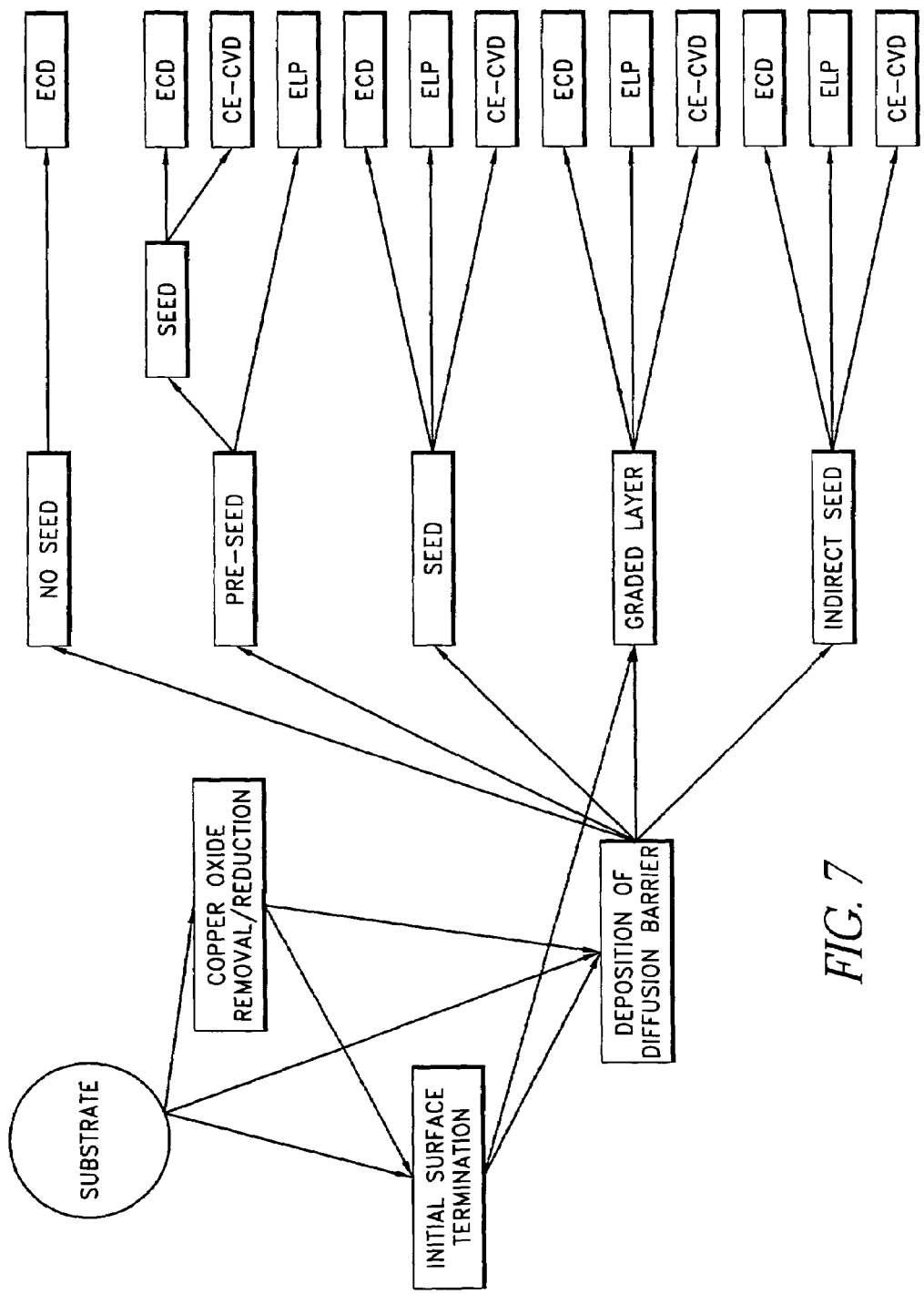
FIG. 7 is a process flow chart illustrating a plurality of process flows for integrated circuit metallization into which the ALD barrier layer processes described herein can be integrated.

After deposition of the diffusion barrier as taught hereinbelow, there are at least five alternatives to continue the processing of the substrates. These include no seed, pre-seed, seed, graded layer and indirect seed alternatives. These alternatives are shown in FIG. 7.

The "no seed" alternative relies on growth of copper metal directly on the diffusion barrier by electrochemical deposition (ECD).

The "pre-seed" alternative is based on the deposition of a very thin layer of conductive material by CVD or ALD on the diffusion barrier. This layer acts as a growth initiation or nucleation layer for the electroless plating ("ELP") of bulk metal or for the CVD growth of the actual seed layer.

The electroless plating technique can utilize very thin seed layers, has good via and trench filling capacity and does not need any electrical contacting of wafers during bulk metal deposition. Electroless plating is based on chemical reduction reactions occurring at about +30° C. to about +80° C. in an aqueous metal salt solution that contains a reducing agent. Metal ions and the reducing agent react with each other on the surfaces of the substrate that is immersed into the solution, thus forming metal on the surfaces of the substrate.

After the deposition of the actual seed layer there are at least two possibilities to continue the processing (FIG. 7). According to the first possibility, vias and trenches are filled with electrochemically deposited copper (i.e. electroplating; "ECD"). According to the second possibility, vias and trenches are filled by the catalytic deposition process described in WO01/78123, the disclosure of which is incorporated herein by reference (catalytically enhanced CVD; "CE-CVD"). In CE-CVD there is a catalyst, preferably a compound containing iodine, on the surfaces of trenches and vias. The surface thus catalytically enhances the CVD growth of copper on vias and trenches.

The "seed" alternative is based on the deposition of an electrically conductive metal thin film on the surface of the diffusion barrier by ALD, CVD or PVD methods. After the deposition of the seed layer there are at least three possibilities to continue the processing of the substrates (FIG. 7). According to the first possibility, vias and trenches are filled with electrochemically deposited copper ("ECD"). According to the second possibility, electroless plating ("ELP") is used for filling the trenches and vias with bulk metal (e.g. copper). In this case the seed layer can be very thin. According to the third possibility, the vias and trenches are filled by the catalytically enhanced CVD of metal (e.g. copper; "CE-CVD").

The "Graded layer" alternative is based on growing the transition layer between the diffusion barrier and the following metallization layer in a graded manner, as presented in US2001/0041250, incorporated herein by reference. The graded layer deposition method can replace the diffusion barrier deposition, because the growth of the graded layer can begin with growth of metal nitride directly on the insulator surfaces of vias and trenches and on the metal surface on the floor of the via. The composition of the growing graded layer is then adjusted towards pure metal (e.g., copper) during the deposition process. After deposition of the graded layer there are at least three possibilities to continue the processing of the substrates (FIG. 7). According to the first possibility, vias and trenches are filled with electrochemically deposited ("ECD") copper. According to the second possibility, electroless plating ("ELP") is used for filling the trenches and vias with bulk metal. According to the third possibility; the vias and trenches are filled by the catalytically enhanced CVD of metal (e.g., "CE-CVD" copper).

Finally, the "indirect seed" alternative (FIG. 7) is based on the method presented in a patent application publication US2002/0004293, incorporated herein by reference. A metal oxide is grown by ALD on the surface of the diffusion barrier. The metal oxide is then reduced into elemental metal, for example with gaseous organic compounds that contain at least one functional group selected from the group consisting of —OH (alcohol), —CHO (aldehyde) and —COOH (carboxylic acid). It is also possible to reduce the metal oxide into elemental metal with activated hydrogen, such as hydrogen plasma. The elemental metal is then used as a seed layer for the deposition of bulk metal. The resulting seed layer can be very thin because the indirect seed method produces very uniform thin films. After the reduction process there are at least three possibilities to continue the processing of the substrates (FIG. 7). According to the first possibility, vias and trenches are filled with electrochemically deposited copper ("ECD"). According to the second possibility, electroless plating ("ELP") is used to fill the trenches and vias with bulk metal. According to the third possibility, the vias and trenches are filled by the catalytically enhanced CVD of metal (e.g., "CE_CVD" copper).

Good results were obtained when copper oxide on the substrate was reduced into copper metal, $WN_xC_y$ was deposited by ALD as described herein, and an indirect seed layer was made by depositing copper oxide with ALD followed by reduction to copper metal.

Nanolaminate Structures

Nanolaminates are layered structures that have enhanced diffusion barrier properties. A nanolaminate consists of multiple thin films and is constructed so as to create very complicated diffusion paths for impurities through disruption of normal crystal growth during deposition. Thus, nanolaminates comprise alternating thin film layers of different phases, for example with different crystal structures and different crystal lattice parameters.

According to one embodiment of the invention, nanolaminate structures are formed on the substrate. The nanolaminate structures preferably are comprised of at least one transition metal compound thin film layer, desirably conductive and serving a diffusion barrier function. The metal compound can, for example, be a metal nitride, metal carbide or metal nitride carbide. The nanolaminate structures may also comprise one or more elemental metal thin film layers.

The nanolaminate structures are preferably layered structures, comprising alternating, stacked thin film layers of materials with different phases with respect to the growth direction of the nanolaminate. The nanolaminate structures preferably comprise materials with at least two different phases. Thus, at least two adjacent thin film layers preferably have a different phase. For example they may have a structure, composition or electrical resistivity different from each other. In a nanolaminate with three layers, at least one of the layers will preferably have a phase different from the other two layers.

The nanolaminates of the present invention can be used, for example, as diffusion barriers in integrated circuits. They can also be used as a reflector for x-rays. The nanolaminate structures, including metal nitride, metal carbide or metal nitride carbide on other conductive barrier layers, are particularly suitable for interconnect barriers. Moreover, these materials are sensitive to attack from hydrogen halides and ammonium halides in the process of deposition. Accordingly, the methods of deposition described below enable quality nanolaminate structures.

Preferred ALD Methods

The methods presented herein allow deposition of conformal metal thin films and nanolaminates on substrate surfaces. In the preferred embodiments the thin films are deposited from aggressive chemicals on sensitive surfaces. Geometrically challenging applications are also possible due to the self-limited nature of the surface reactions.

According to the preferred embodiments, an atomic layer deposition (ALD) type process is used to form metal thin films on substrates, such as integrated circuit workpieces. The substrates preferably include surfaces susceptible to halide attack. Such sensitive surfaces can take a variety of forms.

Examples include but are not limited to silicon, silicon oxide ($SiO_2$), coated silicon, dielectric materials, low-k materials, metals such as copper and aluminum, metal alloys, metal oxides and various nitrides, such as transition metal nitrides and silicon nitride or a combination of said materials. As noted above with respect to FIGS. 4 and 5, the preferred damascene and dual damascene contexts include silicon oxide based insulators and exposed copper lines at the bottom of contact vias.

A substrate or workpiece placed in a reaction chamber is subjected to alternately repeated surface reactions. In particular, thin films are formed by repetition of a self-limiting ALD cycle. Preferably, each ALD cycle comprises at least three distinct phases. In the case of compound metallic thin film deposition, at least three different source chemicals are alternatively employed, corresponding to the three phases. One reactant will form no more than about one monolayer on the substrate surface and includes a metal species desired in the layer being deposited. This reactant, also referred to herein as "the metal reactant," is preferably a halide, and thus the deposited monolayer is terminated with halogen ligands. Another reactant is hydrogen bearing and preferably contains another species desired in the layer being deposited, particularly nitrogen or carbon. This reactant is typically not a halide. In the preferred embodiment the hydrogen-bearing reactant is $NH_3$.

The third reactant is preferably a gettering agent that is capable of scavenging or gettering corrosive species. Thus, the third reactant is able to scavenge halides from the monolayer and/or from the reaction space. In the illustrated embodiments, the third reactant is a carbon compound that is a strong reducer, particularly stronger than $H_2$. Moreover, in one embodiment the third reactant also provides a species desired in the thin film, such as carbon. In the preferred embodiment the gettering agent is triethyl boron ("TEB").

In one phase of the ALD cycle ("the metal phase" or the "first phase"), the reactant comprising a metal species is supplied to the reaction chamber and chemisorbs to the substrate surface. The reactant supplied in this phase is selected such that, under the preferred conditions, the amount of reactant that can be bound to the surface is determined by the number of available binding sites and by the physical size of the chemisorbed species (including ligands). The chemisorbed layer left by a pulse of the metal reactant is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting.

Maximum step coverage on the workpiece surface is obtained when no more than about a single molecular layer of metal source chemical molecules is chemisorbed in each self-limiting pulse. Due to the size of the chemisorbed species and the number of reactive sites, somewhat less than a monolayer may be deposited in each pulse of metal reactant.

In the remaining two phases of the cycle, pulses of source chemicals are allowed to react with the molecules left on the substrate surface by the preceding pulse, if any. In the illustrated embodiment, in the phase following chemisorption of the metal reactant, a hydrogen-bearing source chemical is preferably supplied to the reaction chamber. The hydrogen-bearing source chemical preferably comprises a species that is to be incorporated in the thin film, such as nitrogen, oxygen or carbon. Thus, the desired species is incorporated into the thin film by the interaction of the hydrogen-bearing source chemical with the monolayer left by the metal reactant. This phase is referred to herein as "the second phase" or the "species-contributing phase." In the preferred embodiment the hydrogen-bearing source chemical is ammonia and its reaction with the chemisorbed metal species produces a metal nitride layer on the substrate.

The third phase of the ALD cycle comprises providing a source chemical that is capable of gettering halides from the substrate surface and the reaction chamber. In addition, the gettering agent may comprise a species that may be incorporated into the thin film, such as carbon. This is referred to as the "third phase" or the "gettering phase," although the source chemical may also serve as a carbon precursor.

Although referred to as the "first phase," the "second phase" and the "third phase," these labels are for convenience and do not indicate the actual order of the phases in each ALD cycle. Thus, the initial ALD cycle may be started with any of the three phases described above. However, one of skill in the art will recognize that if the initial ALD cycle does not begin with the metal reactant phase, at least two ALD cycles will need to be completed to deposit about a monolayer of the desired thin film. In addition, the gettering phase preferably does not immediately follow the metal phase. A phase is considered to immediately follow another phase if only a purge or other reactant removal step intervenes.

Additional phases may be added to the ALD cycle as desired. For example, additional phases may be added if additional species are to be incorporated into the thin film.

Unreacted source chemicals and reaction by-products are preferably removed from the reaction space between pulses.

The ALD cycle is preferably repeated until a thin film of the desired thickness, or a nanolaminate with the desired structure is grown.

In accordance with one embodiment, the reactants are selected to avoid etch damage to the workpiece surfaces.

More preferably, the reactants include species that may be harmful to the substrate. Thus, the gettering agent may be chosen to function as a getter during each ALD cycle to scavenge harmful species, thereby protecting sensitive surfaces while still enabling employment of advantageous volatile reactants that are conducive to the self-saturating reaction in each phase.

As described in Example 3, good quality compound metal thin films are formed if the gettering agent is not supplied immediately following the metal reactant phase. Thus, in the preferred embodiment, the gettering phase follows the species-contributing phase. Alternatively, the gettering agent may be supplied in the phase prior to the metal reactant phase. In this case the species contributing phase will follow the metal phase and, as one of skill in the art will recognize, if the cycle is repeated the gettering phase will still follow the species contributing phase.

Figure 5:
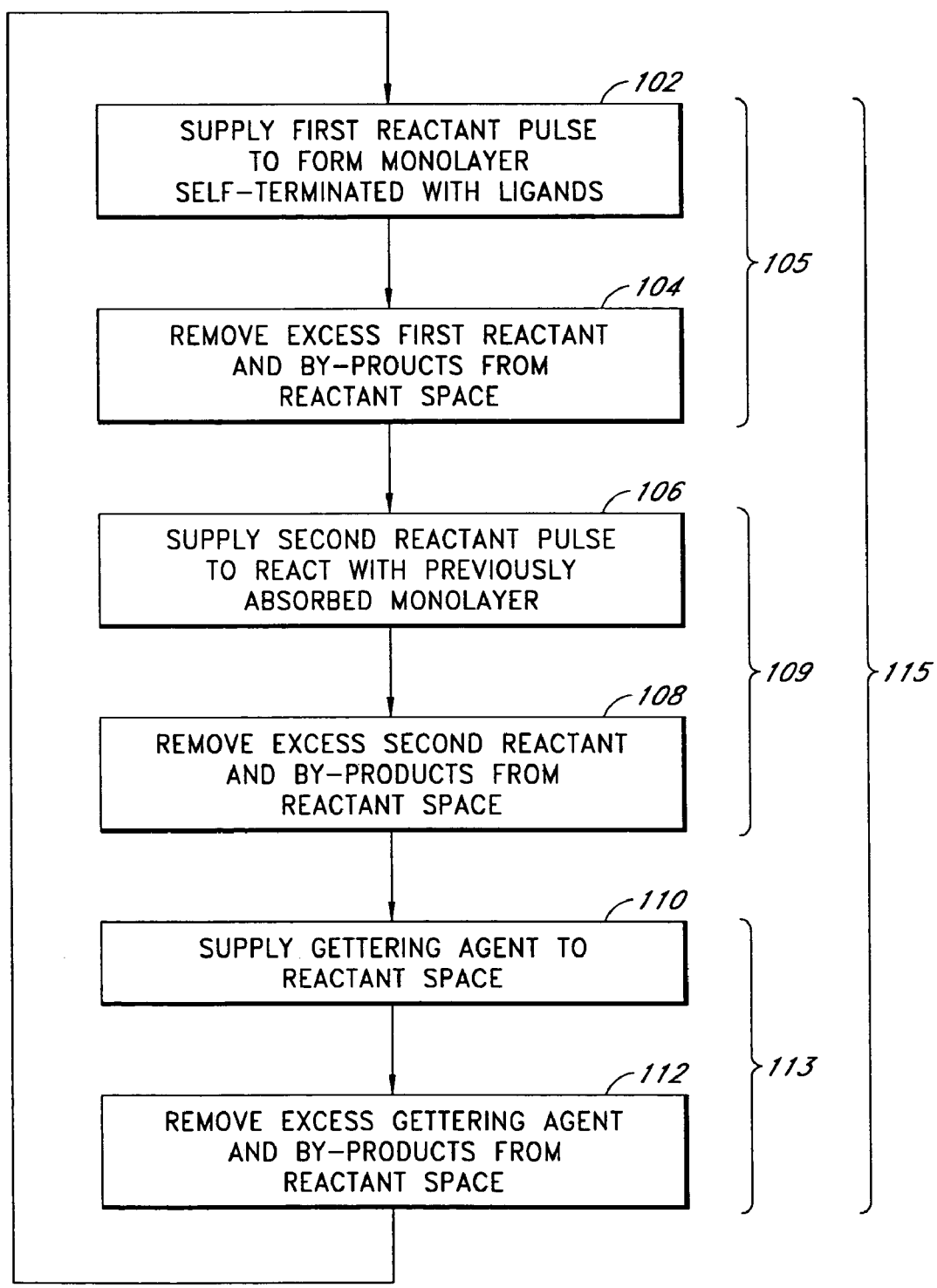
FIG. 5 is a flow chart generally illustrating a method of forming a binary compound by atomic layer deposition (ALD), in accordance with several of the preferred embodiments.
Figure 6A:
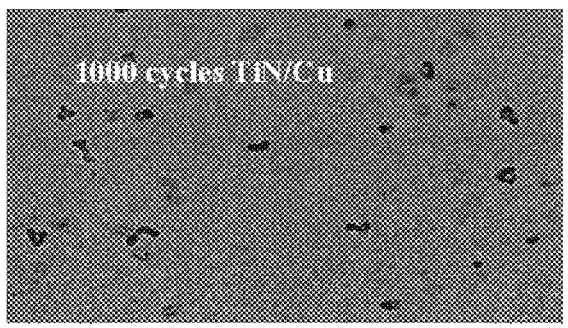
FIG. 6A-D are scanning electron microscope (SEM) pictures illustrating the effect of depositing a WNC layer on copper surface prior to the deposition of a titanium nitride (TiN) thin film.
Figure 6B:
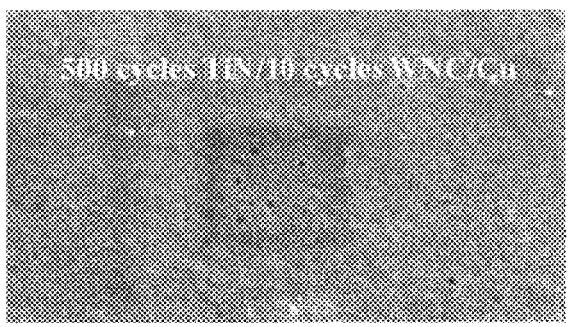
Figure 6C:
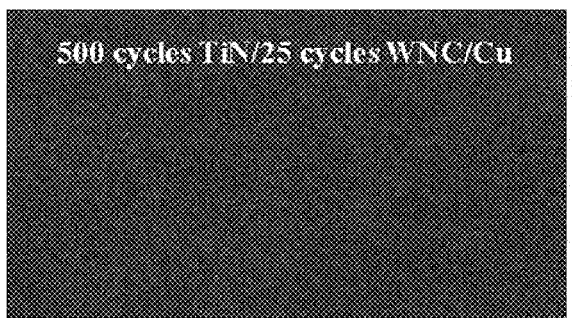
Figure 6D:
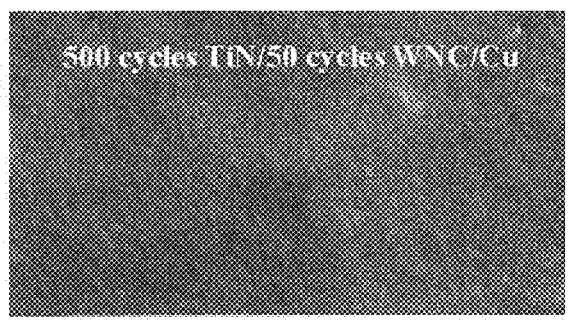

FIG. 5 illustrates generally a three-phase cycle for depositing compound materials. The skilled artisan will appreciate that the principles disclosed here can be readily applied to depositing binary, ternary or more complex materials by ALD. For example, the gettering agent may supply carbon to a growing metal nitride thin film to produce a metal nitride carbide film. Alternatively, additional phases can be added to the cycle to produce a thin film with the desired composition.

An exemplary cycle for depositing tungsten carbon nitride is illustrated below. The cycle may be started with the introduction of any of the three reactants.

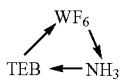

The semiconductor workpiece that includes sensitive surfaces is loaded into a semiconductor-processing reactor. The reactor may be part of a cluster tool, in which a variety of different processes in the formation of an integrated circuit are carried out. An exemplary reactor, designed specifically to enhance ALD processes, is commercially available from ASM Microchemistry of Finland under the tradename Pulsar™ 2000™.

If necessary, the exposed surfaces of the workpiece (e.g., the trench and via sidewall surfaces and the metal floor shown in FIG. 3) are terminated to react with the first phase of the ALD process. The first phase of the preferred embodiment is reactive, for example, with hydroxyl (OH) termination or termination left by an initial ammonia ($NH_3$) treatment. In the examples discussed below, silicon oxide and silicon nitride surfaces of the dual damascene structure do not require a separate termination. Certain metal surfaces, such as at the bottom of the via 60 (FIG. 3), can be terminated, for example, with ammonia treatment.

After initial surface termination, if necessary, a first reactant pulse is supplied 102 (FIG. 5) to the workpiece. In accordance with the preferred embodiment, the first reactant pulse comprises a carrier gas flow and a volatile halide species that is reactive with the workpiece surfaces of interest and further comprises a species that is to form part of the deposited layer. Accordingly, a halogen-containing species adsorbs upon the workpiece surfaces. In the illustrated embodiment, the first reactant is a metal halide, and the thin film being formed comprises a metallic material, preferably metal nitride carbide. The first reactant pulse self-saturates the workpiece surfaces such that any excess constituents of the first reactant pulse do not further react with the monolayer formed by this process. Self-saturation results due to halide tails terminating the monolayer, protecting the layer from further reaction.

The first metal reactant pulse is preferably supplied in gaseous form. In some cases, the reactive species can have a melting point above the process temperature (e.g., CuCl melts at 430° C. while the process is conducted at about 350° C.). Nevertheless, the halide source gas is considered "volatile," for purposes of the present description, if the species exhibits sufficient vapor pressure under the process conditions to transport the species to the workpiece in sufficient concentration to saturate exposed surfaces.

The first reactant is then removed 104 from the reaction space. Preferably, step 104 merely entails stopping the flow of the first chemistry while continuing to flow a carrier gas for a sufficient time to diffuse or purge excess reactants and reactant by-products from the reaction space, preferably with greater than about two reaction chamber volumes of the purge gas, more preferably with greater than about three chamber volumes. Preferably the removal 104 comprises continuing to flow purge gas for between about 0.1 seconds and 20 seconds after stopping the flow of the first reactant pulse. Inter-pulse purging is described in co-pending U.S. patent application having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be pumped down between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 102 and reactant removal 104 represent a first phase 105 in an ALD cycle. The first phase in the illustrated ALD cycle is thus the metal phase.

In the illustrated embodiment, a second reactant pulse is then supplied 106 to the workpiece. The second chemistry desirably reacts with or adsorbs upon the monolayer left by the first reactant. In the illustrated embodiment, this second reactant pulse 106 comprises supplying a carrier gas with a hydrogen-bearing nitrogen (e.g., $NH_3$) source gas to the workpiece. Nitrogen or nitrogen-containing species from the second reactant preferably reacts with the previously adsorbed monolayer to leave a nitrogen compound. In particular, where the first reactant comprises a metal halide, the second reactant leaves no more than about a monolayer of metal nitride. The second reactant pulse 106 also leaves a surface termination that operates to limit the deposition in a saturative reaction phase. Nitrogen and $NH_x$ tails terminating a metal nitride monolayer are non-reactive with $NH_3$ of the second reactant pulse 106.

After a time period sufficient to completely saturate and react the monolayer with the second reactant pulse 106, any excess second reactant is removed 108 from the workpiece. As with the removal 104 of the first reactant, this step 108 preferably comprises stopping the flow of the second chemistry and continuing to flow carrier gas for a time period sufficient for excess reactants and volatile reaction by-products from the second reactant pulse to diffuse out of and be purged from the reaction space. Together, the second reactant pulse 106 and removal 108 represent a second phase 109 in the illustrated process, and can also be considered a non-metal species-contributing phase, since an additional species is contributed to the growing thin film in the reaction. The second phase 109 can also be considered a non-halide species-contributing phase.

When the excess reactants of the second reactant pulse have been removed 108 from the chamber, a third reactant pulse is preferably supplied to the workpiece 110. Preferably the third reactant is a gettering agent that is capable of scavenging or removing halides from the substrate surface and/or the reaction space, such as triethyl boron (TEB). The gettering agent, preferably along with a carrier flow, flows for a period sufficient to saturatively react with the workpiece surfaces. Temperature and pressure conditions are preferably arranged to avoid diffusion of the gettering agent through the monolayer to underlying materials.

After a time period sufficient to completely saturate and react the monolayer with the third reactant, the excess unreacted gettering agent and any reaction by-products (preferably also volatile) are removed 112 from the reaction space, preferably by a purge gas pulse. The removal can be as described for step 104. Together, the gettering agent pulse 110 and removal 112 represent a third phase 113 of the illustrated ALD process, which can also be referred to the gettering phase.

In some arrangements, the gettering agent can also leave a component in the thin film. In one embodiment the gettering agent reacts with the previously adsorbed monolayer to leave a carbon compound. For example, a triethyl boron getter can leave carbon in a growing film, such as a tungsten nitride thin film produced from the reaction of tungsten fluoride and ammonia. The N/C ratio in metal nitride carbide $MN_xC_y$ films can be tailored by adjusting the source chemical pulses and the deposition temperature.

In the illustrated embodiment the three phases described above are alternated. The three phases 105, 109, 113 thus together represent one ALD cycle 1115, which is repeated to form metallic compound monolayers in an ALD process. While in the illustrated embodiment the ALD cycle begins with the metal phase, it is contemplated that in other embodiments the cycle may begin with the species contributing phase or the gettering phase. However, the gettering phase preferably does not immediately follow the metal phase.

In alternative embodiments the order of the phases is changed. For example, the gettering phase may be the first phase of the ALD cycle. One of skill in the art will recognize that the first reactant phase generally reacts with the termination left by the third phase in the previous cycle. Thus, while no reactant may be previously adsorbed on the substrate surface or present in the reaction space if the gettering phase is the first phase in the first ALD cycle, in subsequent cycles the gettering phase will effectively follow the non-metal species-contributing phase.

The ALD cycle 115 is repeated a number of times to produce a film sufficiently thick to perform its desired function.

Though illustrated in FIG. 5 with only three reactants, it will be understood that, in other arrangements, additional chemistries can also be included in each cycle. For example, if necessary, the cycle 115 can be extended to include a distinct surface preparation. Moreover, one or more additional phases can be conducted in each cycle. For example, phases may be included that add additional components to the growing thin film.

In the production of nanolaminates, after the first monolayer is deposited, the starting materials, pulsing parameters and cycle are preferably changed such that the phase of the next monolayer is different and a phase interface is formed between any two film layers. For example, the metal source chemical may be alternated in each repetition of the three-phase cycle, producing alternating layers of metal compounds.

In the preferred embodiment, the first reactant comprises $WF_6$, the second reactant comprise ammonia ($NH_3$), contributing nitrogen to the growing layer, and the third reactant comprises triethyl boron (TEB).

Source Materials

In general, the source materials, (e.g., metal source materials, hydrogen-bearing source materials and gettering agents), are preferably selected to provide sufficient vapor pressure, sufficient thermal stability at substrate temperature and sufficient reactivity of the compounds for effecting deposition by ALD. "Sufficient vapor pressure" supplies enough source chemical molecules in the gas phase to the substrate surface to enable self-saturated reactions at the surface at the desired rate. "Sufficient thermal stability" means that the source chemical itself does not form growth-disturbing condensable phases on the surface or leave harmful level of impurities on the substrate surface through thermal decomposition. In other words, temperatures are kept above the condensation limits and below the thermal decomposition limits of the selected reactant vapors. One aim is to avoid uncontrolled condensation of molecules on the substrate. "Sufficient reactivity" results in self-saturation in pulses short enough to allow for a commercially acceptable throughput time. Further selection criteria include the availability of the chemical at high purity and the ease of handling of the chemical.

1. Metal Source Materials

Metal thin films, such as transition metal nitride layers, are preferably prepared from metal source materials. More preferably they are prepared from the volatile or gaseous compounds of transition metals of groups 3, 4, 5, 6, 7, 8, 9, 10, 11 and/or 12 of the periodic table of the elements. Metal thin film layers may also be made from starting materials comprising Cu, Ru, Pt, Pd, Ag, Au and/or Ir. More preferably, metal and metal nitride source materials comprise transition metal halides.

The metal-containing first reactant of the illustrated embodiments includes a species corrosive to surfaces of the workpiece exposed during the deposition, particularly when combined with the second reactant. In the illustrated embodiments, the corrosive species of the first reactant is advantageous in that it provides a volatile source gas for delivering a desired depositing species. Moreover, the corrosive species facilitates self-limited deposition by forming at least a part of the ligand that inhibits further growth during the first pulse.

Particularly, the first reactants of the preferred embodiments comprise halides, more preferably metal halides and even more preferably transition metal halides comprising elements selected from groups IV (Ti, Zr and Hf), V (V, Nb and Ta) and VI (Cr, Mo and W) in the periodic table of elements. Fluorides, chlorides, bromides and iodides of transition metals are preferably used, more preferably transition metal fluorides, depending on the specific metal. Examples of suitable transition metal fluoride source chemicals include, without limitation, titanium tetrafluoride $TiF_4$, vanadium pentafluoride $VF_5$, niobium pentafluoride ($NbF_5$), tantalum pentafluoride ($TaF_5$), chromium pentafluoride ($CrF_5$), molybdenum hexafluoride ($MoF_6$), molybdenum pentafluoride ($MoF_5$) and tungsten hexafluoride ($WF_6$). $WF_6$ is a preferred tungsten source chemical for the deposition of tungsten nitride carbide ($WN_xC_y$).

As previously noted, metal halides are volatile and therefore excellent vehicles for delivery of metal to the workpiece. Moreover, halogen tails terminate the surface of the chemisorbed monolayer, inhibiting further reaction. The surfaces are thus self-saturated to promote uniform film growth.

In the preferred embodiments and examples below, each of the halide source materials comprises a metal halide that tends to induce etching or corrosion during conventional ALD reactions. Examples 1 and 2, for instance, each indicate corrosion of copper from exposure to ALD processes that include $TiCl_4$ or $WF_6$ pulses.

Low valence metal halides have fewer halogen atoms to donate and can be expected to corrode sensitive surfaces less than high valence metal halides. Metal halide source chemical can be transported over a reducing agent upstream of the substrate space in order to lower the valence or oxidation state of the metal in the metal halide, thus reducing the halide content of the metal halide and decreasing the corrosion probability of substrate surfaces. The method of using a solid or liquid reducing agent upstream of the substrate space is described in pending Finnish patent application FI 19992235.

2. Source Materials for Non-Metal Species-Contributing Reactant

The species-contributing reactant generally includes a species that is desired in the metal thin film, such as oxygen, nitrogen or carbon. Further, the species-contributing compound is preferably volatile or gaseous. In the case of metal nitride deposition the species-contributing compound preferably provides nitrogen to the metal nitride deposition process. In the case of metal nitride deposition, ammonia, for example, is both volatile and highly reactive, promoting rapid reaction with the chemisorbed species from the first reactant. For deposition of metal nitride thin films the species contributing reactant is preferably selected from the following group:

ammonia (NH$_3$);

salts of ammonia, preferably halide salt, in particular ammonium fluoride or ammonium chloride;

hydrogen azide (HN$_3$) and the alkyl derivatives of the said compound such as CH$_3$N$_3$;

Hydrazine (N$_2$H$_4$) and salts of hydrazine such as hydrazine hydrochloride;

organic derivatives of hydrazine such as dimethyl hydrazine;

Nitrogen fluoride (NF$_3$);

primary, secondary and tertiary amines such as methylamine, diethylamine and triethylamine;

nitrogen radicals such as NH$_2$*, NH and N* where "*" designates a free electron capable of forming a bond; and other excited species including nitrogen (N).

Alternatively, the species-contributing reactant can provide carbon or oxygen to a growing thin film.

3. Source Materials for Gettering Agents

The gettering agent is preferably able to scavenge corrosive or otherwise undesirable species, such as from the substrate surface and/or the reaction space. In addition, the gettering agent may contribute a species, such as carbon, to the growing thin film.

3.1 Boron Compounds

One class of boron compounds that may be used is the boranes (B$_x$H$_y$).

Preferred boron compounds comprise hydrocarbon groups. Particularly preferred boron compounds are alklyboron compounds. Examples of suitable boron compounds include, without limitation, trimethyl boron, triethyl boron (TEB), trivinyl boron, triisopropyl boron, triisobutyl boron and tertiarybutyl boron. In the examples below and in the preferred embodiment, triethyl boron (TEB) is employed. However, it will be understood by those skilled in the art that the gettering agent is not limited to TEB, and that the use of other boron compounds is within the scope of the invention.

Of the possible reaction products formed from TEB and corrosive species, the following ones are beneficial for the gettering effect:

Boron halides, formed by the reaction of halogen (e.g., from a metal halide, hydrogen halide or ammonium halide) with the center boron atom of the TEB molecule;

Ethyl halides, formed by the reaction of halogen (e.g., from a metal halide, hydrogen halide or ammonium halide) with an ethyl group of the TEB molecule; or Ethane, formed by the reaction of hydrogen (e.g., from a hydrogen halide molecule) and an ethyl group of the TEB molecule.

Volatile boron compounds having at least one boron-carbon bond are more preferred for certain metals, and hydrocarbon groups bound to boron are even more preferred.

3.2 Silicon Compounds

Silicon compounds with, e.g., alkyl groups bound to silicon may be used as gettering agents. It is assumed that each reaction with a hydrogen halide molecule consumes one silicon-carbon bond. Accordingly, a gettering agent selected from volatile silicon compounds preferably has at least one silicon-carbon bond.

3.3 Germanium and Tin Compounds

Compounds with alkyl groups bound to germanium, as well as alkyl tin compounds, may be capable of gettering halides, halogens or hydrogen halides. Accordingly, a gettering agent may be selected from volatile germanium and tin compounds. Such a gettering agent preferably has at least one germanium-carbon or tin-carbon bond.

3.4 Aluminum Gallium and Indium Compounds

Alkyl aluminum, gallium or indium compounds may be used as gettering agents. However, use of these compounds, such as trimethylaluminum (TMA), may leave carbon on the surfaces. Thus, use of these compounds for gettering halogens or hydrogen halides requires careful setup of ALD process parameters if carbon deposition is not desired. A gettering agent selected from volatile aluminum, gallium or indium compounds preferably has at least one aluminum-carbon, gallium-carbon or indium-carbon bond.

3.5 Carbon Compounds

In the case of carbon compounds, binding of hydrogen halides is possible when a double or triple bonded carbon is present in the molecule. For gettering agents selected from volatile carbon compounds, the compounds preferably have at least one double or triple bond between carbon atoms.

3.6 Nitrogen Compounds

While nitrogen compounds may be used as gettering agents, they are not preferred. The problem is that nitrogen halides are usually thermally unstable. Reactions between alkyl-nitrogen and hydrogen halide compounds forming any nitrogen halide are probably not favorable. However, formation of alkyl chloride from alkyl amine is theoretically possible. Gettering agents selected from volatile amines preferably have negative or near zero value of Gibb's free energy for the reaction between amine and the halogen-bearing species (e.g., hydrogen halide or ammonium halide or free halogen), leading to the formation of halogenated carbon compound.

Certain amines are stronger bases than ammonia (NH$_3$). Such amines can form a salt-like compound with an acidic hydrogen halide molecule without breaking it. The bonding enhances the removal of hydrogen halide from a copper metal surface before any corrosion occurs. Gettering agents selected from volatile amines preferably form sufficiently stable salts with hydrogen halides or have negative or near zero value of free Gibb's energy for the reaction between volatile amine and hydrogen halide that leads to the formation of volatile amine-hydrochloride salts.

3.7 Phosphor compounds

Phosphor halides are quite stable and thus organophosphor compounds may be used as gettering agents. The formation of metal phosphides is a competing reaction and, thus, depending on the application, phosphorus compounds may not be acceptable gettering agents. A gettering agent selected from the phosphor compounds preferably has at least one phosphor-carbon bond.

3.8 Zinc Compounds

Alkyl zinc compounds are commercially available. Currently, zinc is not compatible with state-of-the-art process flows for integrated circuits. However, in circumstances where zinc exposure is acceptable, a gettering agent selected from zinc compounds preferably has at least one zinc-carbon bond.

3.9 Iron and Lead Compounds

Organo-iron and organo-lead compounds form volatile metal halides. A gettering agent selected from iron or lead compounds preferably has at least one iron-carbon or lead-carbon bond.

3.10 Metallocene Compounds

A gettering agent can be selected from volatile metallocenes, such as ferrocene, dicyclopentadienyliron, or volatile derivatives of metallocenes, such as 1,1'-di(trimethylsilyl)ferrocene, said metals being capable of forming volatile metal halides.

3.11 Boron-Silicon Compounds

A gettering agent can also be selected from volatile boron-silicon compounds that preferably have at least one boron-silicon bond, such as tris(trimethylsilyl)borane. Both silicon and boron are capable of forming volatile halides.

3.12 Metal Carbonyl Compounds

A gettering agent can be selected from volatile metal carbonyls or volatile derivatives of metal carbonyls, such as cyclohexadieneiron tricarbonyl, where such metals are preferably capable of forming volatile metal halides.

3.13 General Reaction Equations for Organic Gettering Agents

Volatile compounds of the general formula $E(-CL_3)_m G_n$ can be used as gettering agents. E is an element in periodic table; L is a molecule bonded to carbon C; X is a halogen; G is an unspecified molecule or atom bonded to E; and m and n are integers, where the sum of m and n depends on the valence of E. There is a chemical bond between E and C.

The gettering agents of the formula $E(-CL_3)_m G_n$ are preferably selected such that they can bind halogen or hydrogen halide or can dissociate hydrogen halide or ammonium halide to form non-corroding volatile halogen compounds.

3.14 Silane Borane and Germanium Compounds

Silanes ($Si_x H_y$) and boranes ($B_m H_n$) where x, y, m and n are positive integers, may be used as gettering agents.

Ammonium halides react with silanes and boranes, but they are also capable of disturbing the growth of transition metal nitrides by forming silicon or boron nitride. The reactivity of ammonium halides is based on the well-known fact that they start to dissociate into ammonia ($NH_3$) and hydrogen halide when heated.

When ammonium halide molecules (e.g. $NH_4F$, $NH_4C_1$, $NH_4Br$, $NH_4I$) are believed to be present on the reaction chamber surface, it is preferable to use as little silane or borane as possible to prevent the formation of non-volatile silicon nitride or boron nitride. When hydrogen halide molecules (HF, HCl, HBr, HI) are present on the reaction chamber surface, the dosage of silane or borane is preferably adjusted so that acidic hydrogen halides form silicon halides or boron halides, but there are practically no surplus silane or borane molecules that could bind onto a metallic nitride surface and disturb the metal, metal nitride, metal carbide, or metal nitride carbide growth.

Germanes ($Ge_r H_t$, where r and t are positive integers) can form volatile germanium halides, especially with hydrogen halides, and may be used as gettering agents.

A person skilled in the art will recognize that in addition to pure silicon-hydrogen, boron-hydrogen and germanium-hydrogen compounds, many similar compounds may be useful as gettering agents. In silanes ($Si_x H_y$), boranes ($B_m H_n$) and germanes ($Ge_r H_t$), hydrogen atoms can be replaced by halogen atoms one by one, for example $SiH_4 \rightarrow SiH_3F \rightarrow SiH_2F_2 \rightarrow SiHF_3$. Mixed halogen compounds, such as $SiH_2FCl$, are also possible. Preferably, if these compounds serve as gettering agents there is at least one hydrogen atom bound to silicon, boron or germanium.

As a general rule, a gettering agent selected from silanes, boranes or germanes preferably has at least one hydrogen atom bound to silicon, boron or germanium.

4. Selection Criteria Regarding Source Materials

Metal corrosion is expected if Gibb's free energy (AGf) is negative or near zero for the reaction between metal halide and the metal;
hydrogen halide and the metal; or
ammonium halide and the metal, where the metal represents a sensitive surface during a reaction, and hydrogen halide and/or ammonium halide are formed as by-products of surface reactions.

Silicon compound (e.g., silicon oxide or silicon nitride) corrosion is expected on a surface if Gibb's free energy ($\Delta G_f$) is negative or near zero for the reaction between hydrogen halide and the silicon compound;
ammonium halide and the silicon compound, where the silicon compound represents a sensitive surface during a reaction, and hydrogen halide and/or ammonium halide are formed as by-products of surface reactions.

If theoretical calculations suggest that corrosion is possible, a gettering agent is preferably employed. The gettering agent may combine with corrosive molecules and prevent the corrosion of sensitive surfaces.

The selection of a beneficial gettering agent may be based on molecular simulations. An exemplary simulation program is HyperChem release 4.5, commercially available from Hypercube Inc., Florida, USA. Said program helps to visualize the physical appearance and electrostatic potential geometry of getter molecule candidates and to estimate whether or not molecules, such as triethyl boron, have accessible areas for reacting with corrosive molecules. Simulation of reactions between molecules and surfaces requires more complex software. Cerius$^2$, commercially available from Molecular Simulation Inc. (MSI), USA, is an example of a program capable of predicting the outcome of chemical reactions.

EXAMPLES

In practicing the preferred embodiments, the conditions in the reaction space are preferably arranged to minimize gas-phase reactions that can lead to the formation of condensed material. Thus, reactant chemical pathways are preferably kept separate until entering the reaction space. Reactions between species chemisorbed on the surface and a gaseous reactant self-saturate. Reactions between by-products and a gaseous getter form volatile chemical compounds.

The deposition can be carried out at a wide range of pressure conditions, but it is preferred to operate the process at reduced pressure. The pressure in the reactor is preferably maintained between about 0.01 mbar and 50 mbar, more preferably between about 0.1 mbar and 10 mbar.

The substrate temperature is kept low enough to keep the bonds between thin film atoms below the surface intact and to prevent thermal decomposition of the gaseous source chemicals. On the other hand, the substrate temperature is kept high enough to provide activation energy for the surface reactions, to prevent the physisorption of source materials and minimize condensation of gaseous reactants in the reaction space. Depending on the reactants, the temperature of the substrate is typically about 100° C. to about 700° C., preferably about 250° C. to about 400° C. In a particular embodiment, tungsten nitride carbide is preferably deposited at a substrate temperature of about 275° C. to about 350° C., more preferably from about 300° C. to about 325° C.

The source temperature is preferably set below the substrate temperature. This is based on the fact that if the partial pressure of the source chemical vapor exceeds the condensation limit at the substrate temperature, controlled layer-by-layer growth of the thin film is compromised.

As the growth reactions are based on self-saturated surface reactions, there is no need for setting tight upper boundaries for pulse and purge times. The amount of time available for the pulsing cycle is limited mostly by the economic factors, such as desired throughput of the product from the reactor. Very thin film layers can be formed by relatively few pulsing cycles and in some cases this allows the use of low vapor pressure source materials with relatively long pulse times.

Example 1

The Deposition of TiN from TiCl$_4$ and NH$_3$

A 200-mm silicon wafer coated with PVD copper was loaded into a Pulsar™ 2000™ ALD reactor, commercially available from ASM Microchemistry Oy of Espoo, Finland. The substrate was heated to 400° C. in a flowing nitrogen atmosphere. The pressure of the reactor was adjusted to about 5 mbar by the mass flow controller on the nitrogen line and a vacuum pump. Next, a TiN$_x$ layer was grown by ALD from sequential pulses of TiCl$_4$ and NH$_3$ that were separated by inert nitrogen gas.

One deposition cycle consisted of the following steps:
TiCl$_4$ pulse, for 0.05 s
N$_2$ purge for 1.0 s
NH$_3$ pulse for 0.75 s
N$_2$ purge for 1.0 s This cycle was repeated 300 times to form about a 5-nm TiN$_x$ film. The growth rate of the TiN$_x$ film was about 0.17 Å/cycle. Then the wafer was unloaded from the reactor for analysis. Four-point probe and Energy Dispersive Spectroscopy (EDS) measurements gave a resistivity of 150 μΩcm.

$$6TiCl_4(g)+8NH_3(g) \rightarrow 6TiN+24HCl(g)+N_2(g) \Delta G_f$$
$$(400° C.)=-19 \, kJ \quad [R1]$$

Equation R1 is a simplified presentation of the reaction. It is assumed that there are reactive sites, such as —NH and =NH, on the surface, which attract TiCl$_4$ molecules. After TiCl$_4$ pulse there are probably –TiCl$_3$ and =TiCl$_2$ groups on the surface which can react with the NH$_3$ molecules of the following pulse.

The theoretical result of equation R1 is a uniformly thick TiN$_x$ film over the copper surface. FIG. 2 shows, however, that there was pitting corrosion on the copper film. Corrosion is initiated when HCl, which is formed as a by-product in the nitride growth (R1), reacts with copper. As HCl reacts easily with surplus NH$_3$, forming ammonium chloride (NH$_4$Cl), it is also possible that NH$_4$Cl acts as a gas-phase carrier for copper chloride.

Example 2

Deposition of WN$_x$ from WF$_6$ and NH$_3$

A 200-mm silicon wafer coated with PVD copper was loaded to a Pulsar™ 2000™ ALD reactor. The substrate was heated to 400° C. in a flowing nitrogen atmosphere. The pressure of the reactor was adjusted to about 5 mbar by the mass flow controller on the nitrogen line and a vacuum pump. Next, a WN$_x$ layer was grown by ALD from sequential pulses of WF$_6$ and NH$_3$ that were separated by inert nitrogen gas.

One deposition cycle consisted of the following steps:
WF$_6$ pulse for 0.25 s
N$_2$ purge for 1.0 s
NH$_3$ pulse for 0.75 s
N$_2$ purge for 1.0 s This cycle was repeated 70 times to form about a 5-nm WN$_x$ film. The growth rate of the WN$_x$ film was about 0.6 Å/cycle. Then the wafer was unloaded from the reactor for analysis.

Etch damage to the copper film was visible even under an optical microscope because of the nitride process. A lot of HF was evolved from the process (R2) in proportion to the deposited compound. HF may attack the copper surface (R3). Corrosion of copper was not expected because the vapor pressure of copper fluoride is low at the substrate temperature. HF, however, also readily reacts with surplus NH$_3$ during the ammonia pulse, forming ammonium fluoride. Thus, NH$_4$F can act as a vapor phase carrier for CuF, resulting in corrosion.

$$2WF_6(g)+4NH_3(g) \rightarrow 2WN+12HF(g)+N_2(g) \quad [R2]$$

$$Cu+HF(g) \rightarrow CuF+\tfrac{1}{2}H_2(g) \quad [R3]$$

Example 3

Deposition of WN$_x$ on SiO$_2$

Tungsten nitride thin film is grown by ALD from sequential pulses of WF$_6$, TEB and NH$_3$ that are separated by inert nitrogen gas pulses.

One deposition cycle consists of the following steps:
WF$_6$ pulse for 0.25 s
N$_2$ purge for 1.0 s
TEB pulse for 0.05 s
N$_2$ purge for 1.0 s
NH$_3$ pulse for 0.75 s
N$_2$ purge for 1.0 s The resulting film on the substrate had rather large resistivity variation across the substrate.

Example 4

Deposition of WN$_x$C$_y$ on SiO$_2$

In one experiment, WN$_x$C$_y$ was deposited on a SiO$_2$ surface at 300° C. by an ALD reaction comprising alternating pulses of WF$_6$, NH$_3$ and TEB, in that order.

The deposited film had low resistivity and was visually good looking. In preliminary studies no pitting of copper surfaces on the substrate was observed.

Several additional deposition experiments of tungsten nitride carbide were made. A 200-mm silicon wafer was loaded into a Pulsar® 2000 reactor that is optimized for ALCVD™ processes. The deposition cycle consisted of tungsten hexafluoride (WF$_6$) pulses lasting for 0.1-0.3 s, ammonia (NH$_3$) pulses lasting for 0.1-0.3 s and triethylboron (TEB) pulses lasting for 0.3-0.8 s, depending on the experiment. The source chemical pulses were separated from each other with inert gas flow periods that lasted for 0.5-2.0 s. The number of deposition cycles was 10, 20, 25, 30 or 50 depending on the experiment. The deposition temperature was selected from a temperature range of 225° C.-400° C. depending on the experiment.

The typical growth rate of WN$_x$C$_y$ was about 0.8 Å/cycle. It was observed that good deposition results were obtained when the substrate temperature was in the range of about 275° C. to about 350° C. Very good deposition results were obtained when the substrate temperature was in the range of about 300° C. to about 325° C.

Low energy ion scattering (LEIS) measurements indicated that the film was continuous after 20 deposition cycles, which corresponds to about 1.6 nm of WN$_x$C$_y$. Atomic Force Microscope (AFM) and Scanning Electron Microscope (SEM) images of WN$_x$C$_y$ on SiO$_2$ showed that the film was smooth with randomly oriented nanocrystalline texture. It is possible that the WN$_x$C$_y$ thin film consists of nanocrystalline tungsten carbide in an amorphous tungsten nitride matrix. There was no pitting or other signs of corrosion on the SiO$_2$.

Example 5

Deposition of WN$_x$C$_x$ with a Gettering Agent on Copper Metal

A 200-mm silicon wafer coated with PVD copper is loaded into a Pulsar™ 2000™ ALD reactor. The substrate is heated to approximately 300° C. in a flowing nitrogen atmosphere. The pressure of the reactor is adjusted to about 5 mbar by the mass flow controller on the nitrogen line and a vacuum pump. Tungsten nitride carbide thin film is grown by ALD from sequential pulses of $WF_6$, $NH_3$ and TEB that are separated by inert nitrogen gas pulses.

One deposition cycle consists of the following steps:
$WF_6$ pulse for 0.25 s
$N_2$ purge for 1.0 s
$NH_3$ pulse for 0.75 s
$N_2$ purge for 1.0 s
TEB pulse for 0.05 s
$N_2$ purge for 1.0 s This cycle is repeated to form about a $WN_xC_y$ film of the desired thickness.

Similar results to those of Example 4 were obtained with substrates that had copper film on the surface. It was verified that the deposition process was compatible with copper, and no pitting of copper was observed. $WN_xC_y$ showed excellent diffusion barrier properties even when the thickness of the film was as small as about 2.7 nm (about 30 deposition cycles).

Typically, there is about 55 at.-% of tungsten, about 25-30 at.-% of carbon (probably in the form of carbide) and 15-20 at.-% of nitrogen (probably in the form of nitride) in $WN_xC_y$ samples.

FIGS. 6A-D are scanning electron microscope (SEM) pictures illustrating the effect of depositing a WNC layer on copper surface prior to the deposition of a titanium nitride (TiN) thin film. About 25 deposition cycles, resulting in about 2 nm of tungsten nitride carbide (WNC), clearly protects the copper surface against the corrosive titanium tetrachloride ($TiCl_4$) and ammonia ($NH_3$) used for the subsequent ALD growth of TiN.

Example 6

Deposition of $WN_xC_y$ with a Gettering Agent on Copper Metal

A 200-mm silicon wafer coated with PVD copper is loaded into a Pulsar™ 2000™ ALD reactor. The substrate is heated to approximately 300° C. in a flowing nitrogen atmosphere. The pressure of the reactor is adjusted to about 5 mbar by the mass flow controller on the nitrogen line and a vacuum pump. Tungsten nitride carbide thin film is grown by ALD from sequential pulses of $WF_6$, $NH_3$ and TEB that are separated by inert nitrogen gas pulses.

One deposition cycle consists of the following steps:
TEB pulse for 0.05 s
$N_2$ purge for 1.0 s
$WF_6$ pulse for 0.25 s
$N_2$ purge for 1.0 s
$NH_3$ pulse for 0.75 s
$N_2$ purge for 1.0 s This cycle is repeated to form about a $WN_xC_y$ film of the desired thickness. Results were found similar to those of Example 5.

Example 7

Deposition of $WN_xC_y$ with a Gettering Agent on Copper Metal

A 200-mm silicon wafer coated with PVD copper is loaded into a Pulsar™ 2000™ ALD reactor. The substrate is heated to approximately 300° C. in a flowing nitrogen atmosphere. The pressure of the reactor is adjusted to about 5 mbar by the mass flow controller on the nitrogen line and a vacuum pump. Tungsten nitride carbide thin film is grown by ALD from sequential pulses of $WF_6$, $NH_3$ and TEB that are separated by inert nitrogen gas pulses.

One deposition cycle consists of the following steps:
$NH_3$ pulse for 0.75 s
$N_2$ purge for 1.0 s
TEB pulse for 0.05 s
$N_2$ purge for 1.0 s
$WF_6$ pulse for 0.25 s
$N_2$ purge for 1.0 s This cycle is repeated to form about a $WN_xC_y$ film of the desired thickness. Results were found similar to those of Example 5.

Example 8

Deposition of $WN_xC_y/TiN_xC_y$ Nanolaminate with a Gettering Agent

Two different types of 200-mm wafers are used for the experiment. One wafer has a PVD copper coating while the other wafer has an Electrochemically Deposited (ECD) copper film. The copper-coated wafers are loaded into a Pulsar™ 2000™ ALD reactor, one by one. The substrate is heated to 300° C. in flowing nitrogen atmosphere. The pressure of the reactor is adjusted to about 5 mbar by the mass flow controller on the nitrogen line and a vacuum pump.

First, a $WN_xC_y$ layer is grown by ALD from sequential pulses of $WF_6$, $NH_3$ and triethyl boron (TEB) that are separated by inert nitrogen gas pulses.

One deposition cycle consists of the following steps:
$WF_6$ pulse for 0.25 s
$N_2$ purge for 1.0 s
$NH_3$ pulse for 0.75 s
$N_2$ purge for 1.0 s
TEB pulse for 0.05 s
$N_2$ purge for 0.3 s The deposition cycle is repeated approximately to form a $WN_xC_y$ layer of the desired thickness.

Next, a $TiN_xC_y$ layer, where y is small or zero, is grown over the $WN_xC_y$ layer by ALD from sequential pulses of $TiCl_4$, $NH_3$ and TEB that are separated by inert nitrogen gas pulses. One deposition cycle consists of the following steps:
$TiCl_4$ pulse for 0.05 s
$N_2$ purge for 1.0 s
$NH_3$ pulse for 0.75 s
$N_2$ purge for 1.0 s
TEB pulse for 0.05 s
$N_2$ purge for 0.3 s This cycle is repeated approximately to form a $TiN_xC_y$ film over the $WN_x$ film.

The same deposition program is used for both types of copper-coated silicon.

Example 9

Deposition of $TiN_xC_y$ with a Gettering Agent on Copper Metal

A 200-mm silicon wafer coated with PVD copper is loaded into a Pulsar™ 2000™ ALD reactor. The substrate is heated to 300-400° C. in a flowing nitrogen atmosphere. The pressure of the reactor is adjusted to about 5 mbar by the mass flow controller on the nitrogen line and a vacuum pump. A titanium nitride carbide layer is grown by ALD from sequential pulses of $TiCl_4$, $NH_3$ and TEB that are separated by inert nitrogen gas pulses.

One deposition cycle consists of the following steps:
$TiCl_4$ pulse for 0.05 s
$N_2$ purge for 1.0 s
$NH_3$ pulse for 0.75 s
$N_2$ purge for 1.0 s
TEB pulse for 0.05 s
$N_2$ purge for 1.0 s This cycle is repeated to form a $TiN_xC_y$ film where y is small or zero.

Example 10

Deposition of a Nanolaminate Structure

A silicon substrate is loaded into an F-200™ ALD reactor, commercially available from ASM Microchemistry, Oy of Espoo, Finland. The reactor pressure is balanced to 5 mbar absolute by a vacuum pump and flowing nitrogen. The substrate is heated to 360° C. First, a titanium nitride film is grown on the substrate by repeating a pulsing sequence. Inert nitrogen gas carries titanium tetrachloride vapor into the reaction chamber. Surplus $TiCl_4$ and reaction by-products are purged away with $N_2$ gas. After purging, $N_2$ gas carries ammonia vapor to the reaction chamber. Surplus $NH_3$ and reaction by-products are purged away with $N_2$ gas. After purging, $N_2$ gas carries TEB vapor to the reaction chamber. Surplus TEB and reaction by-products are purged away with $N_2$ gas.

$TiCl_4$ pulse for 0.05 s
$N_2$ purge for 1.0 s
$NH_3$ pulse for 0.75 s
$N_2$ purge for 1.0 s
TEB pulse for 0.05 s
$N_2$ purge for 0.3 s A tungsten nitride carbide thin film is grown on top of the titanium nitride carbide film by repeating another pulsing sequence:
$WF_6$ pulse for 0.25 s
$N_2$ purge for 1.0 s
$NH_3$ pulse for 0.75 s
$N_2$ purge for 1.0 s
TEB pulse for 0.05 s
$N_2$ purge for 0.3 s The processing is continued by depositing alternating thin film layers of titanium and tungsten nitride carbide. Nitride carbide thin film layers are deposited until the desired thickness is achieved. The film appears as a dark, light reflecting mirror. The color is slightly reddish, unlike either titanium or tungsten nitride.

Example 11

Deposition of Deposition of $WN_xC_y$ with a Gettering Agent

A substrate is loaded into a reaction space. Tungsten nitride carbide thin film is grown by ALD from sequential pulses of $WF_6$, $NH_3$ and TEB that are separated by inert nitrogen gas pulses.

One deposition cycle consists of the following steps:
$WF_6$ pulse for 0.25 s
$N_2$ purge for 1.0 s
$NH_3$ pulse for 0.75 s
$N_2$ purge for 1.0 s
TEB pulse for 0.05 s
$N_2$ purge for 1.0 s
$NH_3$ pulse for 0.75 s
$N_2$ purge for 1.0 s This cycle is repeated to form about a $WN_xC_y$ film of the desired thickness.

The ALD cycle disclosed herein has significant advantages over previously known ALD cycles. By ensuring that the pulse of the gettering agent does not immediately follow the metal phase, better quality metallic thin films are formed than when the gettering agent follows the metal halide. In particular, while metallic thin films formed by pulsing $WF_6$, TEB and $NH_3$ in sequence may be hazy, have poor adhesion and be powdery, metallic thin films formed by pulsing $WF_6$, $NH_3$ and TEB in sequence are good looking and have good adhesion.

Although the foregoing invention has been described in terms of certain preferred embodiments, other embodiments will be apparent to those of ordinary skill in the art, in view of the disclosure herein. Accordingly, the present invention is not intended to be limited by the recitation of the preferred embodiments, but is instead to be defined by reference to the appended claims.

What is claimed is:

1. A process for producing an integrated circuit comprising:
   forming a damascene structure including trenches in an insulating material on a substrate;
   placing the substrate in a reaction chamber;
   depositing a metal nitride carbide diffusion barrier by an atomic layer deposition (ALD) process; and
   depositing metal over the metal carbide nitride.

2. The method of claim 1, wherein the ALD process comprises a plurality of cycles, each cycle comprising at least one pulse of a gettering agent.

3. The method of claim 2, wherein the ALD process comprises providing pulses of a metal halide and an intervening reactant, wherein a pulse of the gettering agent does not immediately follow a pulse of the metal halide.

4. The method of claim 2, wherein a pulse of the gettering agent is provided before a pulse of the metal halide and a pulse of the intervening reactant is provided after the pulse of the metal halide in each of the plurality of cycles.

5. The method of claim 4, wherein the first cycle starts with pulse of gettering agent.

6. The method of claim 4, wherein the intervening reactant pulse comprises a pulse of $NH_3$.

7. The method of claim 4, wherein the metal halide comprises $WE_6$.

8. The method of claim 4, wherein the gettering agent comprises a boron compound.

9. The method of claim 8, wherein the boron compound comprises triethylboron.

10. The method of claim 1, wherein the substrate comprises exposed copper oxide and the exposed copper oxide is reduced prior to depositing the metal nitride carbide diffusion barrier.

11. The method of claim 10, wherein the exposed copper oxide is reduced with a compound selected from the group consisting of alcohols, aldehydes and carboxylic acids.

12. The method of claim 10, wherein the exposed copper oxide is reduced with hydrogen plasma.

13. The method of claim 10, additionally including treating surfaces of the substrate surface with ammonia following reduction of the exposed copper oxide.

14. The method of claim 1, additionally including depositing a metal oxide on the substrate and reducing the metal oxide to metal, after depositing the metal nitride carbide diffusion barrier and prior to depositing metal over the metal nitride carbide.

15. The method of claim 14, wherein reducing the metal oxide comprises exposure to a compound selected from the group consisting of alcohols, aldehydes and carboxylic acids.

16. The method of claim 1, additionally comprising depositing a seed layer over the metal nitride carbide prior to depositing metal over the metal nitride carbide.

17. The method of claim 1, wherein the metal nitride carbide is $WN_xC_y$.

18. The method of claim 17, wherein the $WN_xC_y$ comprises about 55 at.-% of tungsten, about 25-30 at.-% of carbon and about 15-20 at.-% of nitrogen.

19. The method of claim 17, wherein depositing the metal nitride carbide diffusion barrier is carried out at temperatures from 275 to 350 C.

20. The method of claim 17, wherein a thickness of the $WN_xC_y$ is less than 5 nm.

21. The method of claim 1, wherein the metal deposited over the metal nitride carbide is copper.

22. The method of claim 21, wherein the copper is deposited by a method selected from the group consisting of electroless plating, electrochemical deposition, chemical vapor deposition and catalytically enhanced chemical vapor deposition.

23. The method of claim 1, wherein the insulating material consists essentially of a low-k material.

24. The method of claim 1, wherein the insulating material comprises silicon oxide deposited by chemical vapor deposition.

25. The method of claim 23, wherein the low-k material is selected from the group consisting of polymeric materials, porous materials and fluorine-doped oxides.

26. The method of claim 1, wherein the reaction chamber is part of a cluster tool.

27. The method of claim 1, wherein the insulating material is selected from the group consisting of polymeric materials, porous materials and fluorine-doped oxides.

* * * * *

UNITED STATES PATENT AND TRADEMARK OFFICE
CERTIFICATE OF CORRECTION

| | |
|---|---|
| PATENT NO. | : 7,410,666 B2 |
| APPLICATION NO. | : 11/286203 |
| DATED | : August 12, 2008 |
| INVENTOR(S) | : Kai Elers and Wei-Min Li |

It is certified that error appears in the above-identified patent and that said Letters Patent is hereby corrected as shown below:

At Title page 2, column 2, line 60 Other Publication (under item 56), Delete "Thins" and insert -- Thin --, therefor.

At column 4, line 30, Delete "$\leq 1$" and insert -- $\leq 10$ --, therefor.

At column 7, line 54, Delete "possibility;" and insert -- possibility, --, therefor.

At column 13, line 3, Delete "1115," and insert -- 115, --, therefor.

At column 16, line 1, Delete "Aluminum" and insert -- Aluminum, --, therefor.

At column 17, line 20, Delete "Silane" and insert -- Silane, --, therefor.

At column 17, line 30, Delete "$NH_4C_l$," and insert -- $NH_4Cl$, --, therefor.

At column 17, line 59, Delete "(AGf)" and insert -- ($\Delta G_f$) --, therefor.

At column 20, line 63, Delete "$WN_xC_x$" and insert -- $WN_xC_y$ --, therefor.

At column 24, line 49, In Claim 7, delete "$WE_6$." and insert -- $WF_6$. --, therefor.

Signed and Sealed this

Twenty-seventh Day of January, 2009

JOHN DOLL
*Acting Director of the United States Patent and Trademark Office*